(12) United States Patent
Sun

(10) Patent No.: US 11,139,448 B2
(45) Date of Patent: Oct. 5, 2021

(54) DISPLAY DEVICE AND TEST METHOD FOR MOISTURE BLOCKING EFFECT OF DISPLAY DEVICE

(71) Applicant: Wuhan China Star Optoelectronics Semiconductor Display Technology Co., Ltd., Hubei (CN)

(72) Inventor: Yexi Sun, Guangdong (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 589 days.

(21) Appl. No.: 16/074,532

(22) PCT Filed: May 11, 2018

(86) PCT No.: PCT/CN2018/086473
§ 371 (c)(1),
(2) Date: Aug. 1, 2018

(87) PCT Pub. No.: WO2019/174118
PCT Pub. Date: Sep. 19, 2019

(65) Prior Publication Data
US 2021/0098735 A1    Apr. 1, 2021

(30) Foreign Application Priority Data

Mar. 12, 2018 (CN) .......................... 201810199591.8

(51) Int. Cl.
*H01L 51/52* (2006.01)
*H01L 51/00* (2006.01)
(Continued)

(52) U.S. Cl.
CPC ....... *H01L 51/5237* (2013.01); *G01N 27/048* (2013.01); *G09G 3/006* (2013.01); *H01L 51/0031* (2013.01); *H01L 51/56* (2013.01)

(58) Field of Classification Search
CPC . H01L 51/5237; H01L 51/0031; H01L 51/56; G01N 27/048; G09G 3/006
See application file for complete search history.

(56) References Cited

U.S. PATENT DOCUMENTS 9,469,774 B2 * 10/2016 Tregub ................ H01L 51/0007
2004/0070413 A1 * 4/2004 Kasukabe ............. G01R 1/0735
324/754.07
(Continued)

FOREIGN PATENT DOCUMENTS

CN         1642367 A       7/2005
CN       101632010 A       1/2010
(Continued)

OTHER PUBLICATIONS

Chinese Office Action issued in corresponding Chinese Patent Application No. 201810199591.8 dated Feb. 25, 2019, pp. 1-9.

*Primary Examiner* — Seahvosh Nikmanesh
(74) *Attorney, Agent, or Firm* — Leong C. Lei

(57) ABSTRACT

A display device comprises a light emitting base layer, a transporting layer, a metal layer and a packaging layer that are sequentially stacked; the transporting layer comprising a conductive lead wire and a test pin; the metal layer comprising a plurality of metal blocks arranged in an array, each of the metal blocks being electrically connected to the test pin through the conductive lead wire; and the packaging layer being used for blocking outside moisture from contacting the metal layer, by testing the electric resistance of the metal block electrically connected to the test pin, determining the moisture blocking effect of the area of the packaging layer corresponding to the metal block. The (Continued)

moisture blocking effect of the area of packaging layer corresponding to the metal block can be determined, and the area where the moisture blocking effect of the packaging layer is poor can be accurately determined.

11 Claims, 4 Drawing Sheets

(51) Int. Cl.
*H01L 51/56* (2006.01)
*G01N 27/04* (2006.01)
*G09G 3/00* (2006.01)

(56) References Cited

U.S. PATENT DOCUMENTS

| | | | | |
|---|---|---|---|---|
| 2014/0374703 | A1* | 12/2014 | Jung | H01L 51/0031 257/40 |
| 2016/0064673 | A1* | 3/2016 | Park | H01L 27/3258 257/40 |
| 2018/0358574 | A1* | 12/2018 | Musa | H01L 51/441 |
| 2020/0185483 | A1* | 6/2020 | Peng | H01L 27/3276 |

FOREIGN PATENT DOCUMENTS

| | | |
|---|---|---|
| CN | 102903828 A | 1/2013 |
| CN | 103217459 A | 7/2013 |
| CN | 105280675 A | 1/2016 |
| CN | 107449704 A | 12/2017 |
| CN | 107742635 A | 2/2018 |

\* cited by examiner

US 11,139,448 B2

DISPLAY DEVICE AND TEST METHOD FOR MOISTURE BLOCKING EFFECT OF DISPLAY DEVICE

RELATED APPLICATION

This application is a National Phase of International Application Number PCT/CN2018/086473, filed May 11, 2018, and claims priority to Chinese Patent Application No. 201810199591.8, entitled "DISPLAY DEVICE AND TEST METHOD FOR MOISTURE BLOCKING EFFECT OF DISPLAY DEVICE", filed on Mar. 12, 2018, the disclosure of which is incorporated herein by reference in its entirety.

FIELD OF THE INVENTION

The present invention relates to a display technology field, in particular to a display device and a test method for moisture blocking effect of the display device.

BACKGROUND OF THE INVENTION

With the development of science and technology, flexible display device shows more and more extensive application prospects. Flexibility of the flexible display device realizes the diversification of products and achieves outstanding display and appearance effects. The flexible display device generally uses an organic light-emitting diode (OLED) display screen.

Since the lifetime of the OLED device is easily affected by moisture, the flexible display device generally uses a film-like packaging layer to block moisture from entering the light emitting layer of OLED. The packaging effect of the packaging affects the moisture blocking effect of the packaging layer, thereby affecting the ability of the flexible display device to prevent moisture erosion, and has a great influence on the service life of the flexible display device.

SUMMARY OF THE INVENTION

The present invention provides a display device and a test method for moisture blocking effect of the display device to solve the problem that the defect of the packaging layer of the display device cannot be detected in the prior art.

In order to achieve the above goal; the present invention provides a display device, which comprises a light emitting base layer, a transporting layer, a metal layer, and a packaging layer that are sequentially stacked;

the transporting layer comprising a conductive lead wire and a test pin;

the metal layer comprising a plurality of metal blocks arranged in an array, each of the metal blocks is electrically connected to the test pin through the conductive lead wire; and the packaging layer being used for blocking outside moisture from contacting the metal layer, by testing the electric resistance of the metal block electrically connected to the test pin, determining the moisture blocking effect of the area of the packaging layer corresponding to the metal block.

The material of the metal layer disclosed herein is one of calcium and magnesium.

Each of the metal blocks disclosed herein is electrically connected to four of the test pins, and each of the test pins is electrically connected to the metal block through one of the conductive lead wires, and the two test pins are electrically connected to a current source, and the other two test pins are electrically connected to a voltmeter.

The material of the metal layer disclosed herein is one of calcium and magnesium.

A connection point is formed between the conductive lead wire and the metal block, and the distance between two adjacent connection points of the four is the same.

The material of the metal layer disclosed herein is one of calcium and magnesium.

The vertical projection of the test pin on the light emitting base layer is positioned at the edge of the light emitting base layer.

The material of the metal layer disclosed herein is one of calcium and magnesium.

The light emitting base layer disclosed herein may comprise a substrate and a light emitting layer, and the light emitting layer is positioned between the transporting layer and the substrate, and the light emitting layer is used to emit light to display an image.

The material of the metal layer disclosed herein is one of calcium and magnesium.

The display device disclosed herein may further comprise an insulating layer positioned between the transporting layer and the light emitting layer, the insulating layer is used for isolating the transporting layer from the light emitting layer.

The packaging layer disclosed herein may comprise a first portion and a second portion which are interconnected into one body, and the first portion is stacked on the metal layer, the second portion is filled between the metal blocks and used for isolating adjacent metal blocks.

The present invention provides a test method for moisture blocking effect of the display device, which comprises:

providing a display device, wherein the display device comprises a light emitting base layer, a transporting layer; a metal layer and a packaging layer, and the transporting layer is disposed on the light emitting base layer, and the transporting layer comprises a conductive lead wire and a test pin, and the metal layer is stacked on the transporting layer, the metal layer comprises a plurality of metal blocks arranged in an array, each of the metal blocks is electrically connected to the test pin through the conductive lead wire, and the packaging layer covers the metal layer;

placing the display device in a test environment;

determining the moisture blocking effect of the area of the packaging layer corresponding to the metal block by testing the electric resistance of the metal block electrically connected to the test pin.

Each of the metal blocks disclosed herein is electrically connected to four of the test pins, and each of the test pins is electrically connected to the metal block through one of the conductive lead wires, the "testing the electric resistance of the metal block electrically connected to the test pin" comprises:

connecting a current source to the two test pins electrically, and connecting a voltmeter to the two other test pins electrically, determining the electric resistance change of the metal block by testing the voltage change of the metal block.

A connection point is formed between the conductive lead wire and the metal block, and the distance between two adjacent connection points of the four is the same.

The vertical projection of the test pin on the light emitting base layer is positioned at the edge of the light emitting base layer.

The light emitting base layer disclosed herein may comprise a substrate and a light emitting layer, and the light emitting layer is positioned between the transporting layer and the substrate, and the light emitting layer is used to emit light to display an image.

The display device disclosed herein may further comprise an insulating layer positioned between the transporting layer and the light emitting layer, the insulating layer is used for isolating the transporting layer from the light emitting layer.

The packaging layer disclosed herein may comprise a first portion and a second portion which are interconnected into one body, and the first portion is stacked on the metal layer, the second portion is filled between the metal blocks and used for isolating adjacent metal blocks.

The material of the metal layer disclosed herein is one of calcium and magnesium.

The embodiment of the present invention has following beneficial effect: after the moisture penetrates through the packaging layer, it will undergo a redox reaction with the metal block, and the electric resistance of the metal block will change. The metal blocks are arranged in an array, each metal block corresponds to a area of the packaging layer, the ohmmeter contacts the test pin to monitor the electric resistance change of the metal block connected to the test pin, the moisture blocking effect of the area of packaging layer corresponding to the metal block can be determined through the electric resistance change of the metal block, and the area where the moisture blocking effect of the packaging layer is poor can be accurately determined, which is favorable for discovering the defects in the manufacturing process of the display device and can be used for evaluating whether the packaging process is qualified, and increasing the yield rate and reducing production costs.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other obvious various embodiments according to these figures without paying the premise.

DETAILED DESCRIPTION OF PREFERRED EMBODIMENTS

Embodiments of the present invention are described in detail with the technical matters, structural features, achieved objects, and effects with reference to the accompanying drawings as follows. It is clear that the described embodiments are part of embodiments of the present invention, but not all embodiments. Based on the embodiments of the present invention, all other embodiments to those of ordinary skill in the premise of no creative efforts obtained, should be considered within the scope of protection of the present invention.

Figure 1:
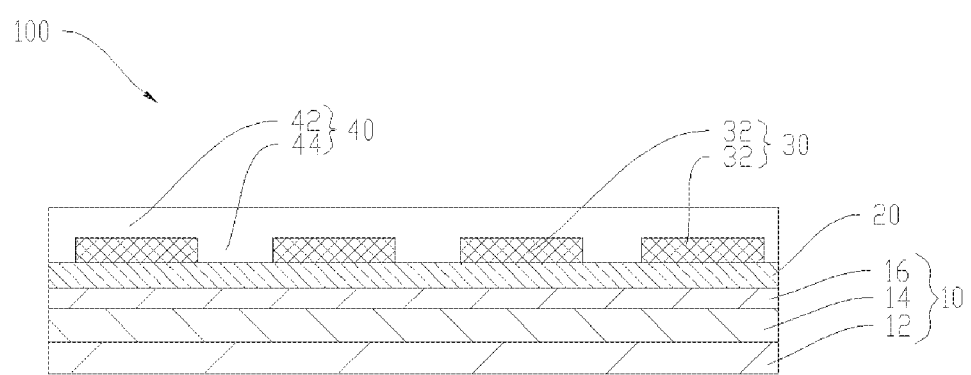
FIG. 1 is a cross section structure diagram of a display device according to an example of the present invention.
Figure 2:
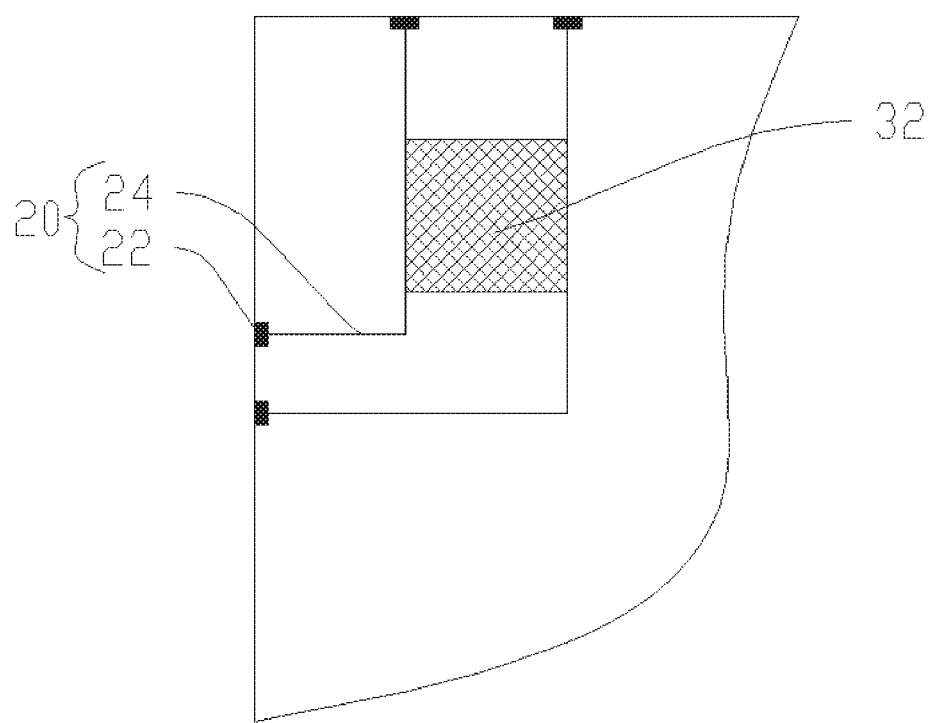
FIG. 2 is a top view diagram of a partial structure of a display device according to an example of the present invention.

Please refer to FIG. 1 and FIG. 2. The display device 100 provided by the example of the present invention is used for displaying an image. In an embodiment, the display device 100 provided by the embodiment of the present invention is a flexible display device, specifically, the display device 100 is an OLED display screen, the OLED display has an excellent display effect and can be used to form a curved display screen. In this example, the flexible display devices comprises, but are not limited to, cell phones, displays, laptops, tablets, smart watches, and the like. Specifically, the display device 100 may be used only for display, and may also integrate the touch panel to form the display device 100 with a touch function.

According to FIG. 1 specifically, the display device 100 provided by the example of the present invention comprises a light emitting base layer 10, a transporting layer 20, a metal layer 30, and a packaging layer 40 that are sequentially stacked. Further, the light emitting base layer 10 is a structure for the display device 100 to display an image. Specifically, the light emitting base layer 10 comprises a substrate 12 and a light emitting layer 14 disposed on the substrate 12. The substrate 12 has an appropriate strength and is not easily broken. The substrate 12 is the main bearing structure of the display device 100, the light emitting base layer 10, the transporting layer 20, the metal layer 30, and the packaging layer 40, and the like are all disposed on the substrate 12. In an embodiment, the substrate 12 is a flexible substrate 12, in other words, the substrate 12 may be curved so as to be suitable for a flexible display device. Further, the substrate 12 may be a transparent substrate 12, such as a glass substrate 12 or a plastic substrate 12, and the like. In this example, the light emitting layer 14 is disposed on the substrate 12. In an embodiment, the light emitting layer 14 is formed on the substrate 12 by physical vapor deposition or chemical vapor deposition. The light emitting layer 14 is used to emit light to form an image, specifically, the light emitting layer 14 comprises a light emitting material layer and a driving circuit layer, the driving circuit layer is electrically connected to a power source, and the driving circuit layer drives the pixels of the corresponding light emitting material layer to emit light, thereby forming an image to be displayed. In this example, the light emitting material layer is made of an organic light emitting material, and the light emitting material layer has a better display effect and also has a better curved characteristic. Further, the driving circuit layer can also be curved so as to adapt to the flexing requirement of the flexible display device.

Combining FIG. 1 and FIG. 2. In this example, the transporting layer 20 is disposed on the light emitting base layer 10, specifically, the transporting layer 20 is disposed on the side of the light emitting layer 14 away from the substrate 12, that is, the light emitting layer 14 is positioned between the transporting layer 20 and the substrate 12. In an embodiment, the transporting layer 20 is made of a transparent conductive material, such as indium tin oxide (ITO). According to FIG. 2, the transporting layer 20 comprises a conductive lead wire 24 and a test pin 22. In an embodiment, the conductive lead wire 24 and the test pin 22 are formed after the transporting layer 20 is patterned, such as laser etching, chemical etching, or the like. In this example, the test pin 22 is a rectangular or circular sheet-like structure that can be used to contact the probe of the ohmmeter 50.

Please continue to refer to FIG. 1. In this example, the metal layer 30 is stacked on the transporting layer 20, and the metal layer 30 is made of an active metal material that easily undergoes a redox reaction with water, such as magnesium, calcium, and the like. Combining with FIG. 2, the metal layer 30 comprises a plurality of metal blocks 32, specifically, the metal blocks 32 are arranged in an array, and each metal block 32 has the same size. In an embodiment, the metal blocks 32 are rectangular, and the metal blocks 32 arranged in an array are covered on the transporting layer 20. In this example, each of the metal blocks 32 is electrically connected to the test pin 32 through the conductive lead wire 24. Specifically, each test pin 22 is electrically connected to the metal block 32 through one of the conductive lead wire 24.

Please continue to refer to FIG. 1. In this example, the packaging layer 40 covers the metal layer 30. The packaging layer 40 is used to block moisture, by testing the electric resistance of the metal block 32 electrically connected to the test pin 22, the moisture blocking effect of the area of the packaging layer 40 corresponding to the metal block 32 is determined. Specifically, the packaging layer 40 is a film-like layer structure with the appropriate moisture blocking capability, the packaging layer 40 covers the metal layer 30, and isolates the metal layer 30 from the outside, the outside moisture can only come into contact with the metal layer 30 after the moisture penetrates through the packaging layer 40. When the packaging effect of the packaging layer 40 is poor, or the material and thickness of the packaging 40 do not meet the requirements, the moisture blocking effect of the packaging layer 40 is poor, so that the moisture enters into the display device 100 and contacts the metal layer 30 and reacts with the metal block 32, causing the electric resistance change of the metal block 32. Further, when the packaging effect of a certain area of the packaging layer 40 is poor, the metal block 32 corresponding to the area reacts with moisture. In this example, the electric resistance of the metal block 32 connected to the test pin 22 is tested by contacting the ohmmeter 50 to the test pin 22. Further, the ohmmeter 50 may provide a current source and voltage test mode, and the connection of the metal block 32 to the ohmmeter 50 may also be understood as the connection of metal block 32 to the current source and the voltmeter.

The moisture will undergo redox reaction with the metal block 32 after penetrating through the packaging layer 40, and the electric resistance of the metal block 32 will change. The metal blocks 32 are arranged in an array, each metal block 32 corresponds to a area of the packaging layer 40, the ohmmeter contacts 50 the test pin 22 to monitor the electric resistance change of the metal block 32 connected to the test pin 22, the blocking effect of the area of packaging layer 40 corresponding to the metal block 32 can be determined through the electric resistance change of the metal block 32, and the area where the moisture blocking effect of the packaging layer 40 is poor can be accurately determined, which is favorable for discovering the defects in the manufacturing process of the display device 100 and can be used for evaluating whether the packaging process is qualified, and increasing the yield rate and reducing production costs.

Please refer to FIG. 2. In this example, each of the metal blocks 32 is electrically connected to four of the test pins 22, and each of the test pins 22 is electrically connected to the metal block 32 through one of the conductive lead wires 24, and the two test pins 22 are electrically connected to a current source, and the other two test pins 22 are electrically connected to a voltmeter. Specifically, when testing the electric resistance of the metal block 32, two test pins 22 are electrically connected to the current source, so that the current flows through the metal block 32, the other two test pins 22 are electrically connected to the voltmeter, i.e., the voltmeter is connected in parallel with the metal block 32, and the voltmeter measures the voltage of the metal block 32 when current flows through the metal block 32, thereby calculating the electric resistance of the metal block 32 according to Ohm's law. In an embodiment, during the period of monitoring the electric resistance change of the metal block 32, the current value of the current source connected to the metal block 32 is constant, so that the voltage change of the metal block 32 can reflect the electric resistance change of the metal block 32, that is, the electric resistance change can reflect the blocking effect of the packaging layer 40.

Please continue to refer to FIG. 2. In this example, a connection point is formed between the conductive lead wire 24 and the metal block 32, and the distance between two adjacent connection points of the four is the same. In an embodiment, the metal block 32 is a square, and the connection points between the four conductive lead wires 24 and the metal block 32 are respectively positioned at the four corners of the metal block 32 so that the distance between two adjacent connection points of the four is the same. In this example, the distance between two adjacent connection points of the four is the same, the current input to the metal block 32 from the current source can be made to flow uniformly through the metal block 32, so that the voltage of the metal block 32 measured by the voltmeter can be more accurate. Further, the measurement position of the voltmeter helps to increase the measurement accuracy of voltmeter.

Figure 3:
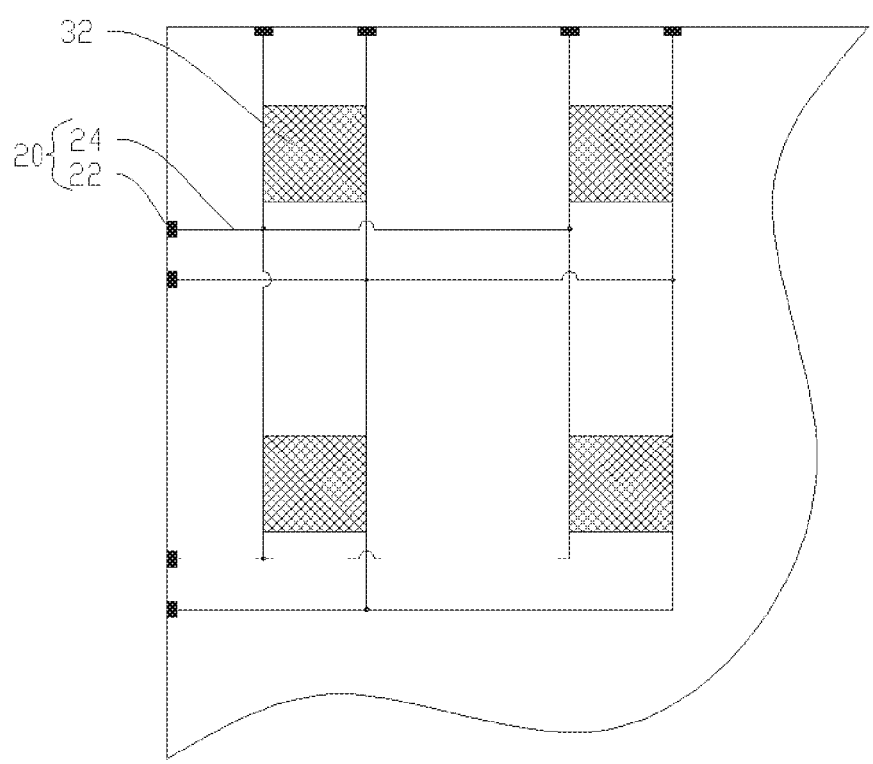
FIG. 3 is a top view diagram of a partial structure of an embodiment of a display device according to an example of the present invention.

Please continue to refer to FIG. 2. In this example, the vertical projection of the test pin 22 on the light emitting base layer 10 is positioned at the edge of the light emitting base layer 10. Specifically, the test pin 22 is arranged along the edge of the display device 100, so that the probe of the ohmmeter 50 is easy to contact the test pin 22. In other words, the probe of the ohmmeter 50 can contact the test probe from the edge of the display device 100 to test the electric resistance of the metal block 32, without damaging the packaging layer 40. In this example, as shown in FIG. 3, there are a plurality of metal blocks 32, and the metal blocks 32 are arranged in an array, there are also a plurality of the test pins 22, each metal block 32 corresponds to four test pins 22, the conductive lead wires 24 are staggered to electrically connect the metal block 32 to the corresponding test pin 22.

Please refer to FIG. 1. In this example, the light emitting base layer 10 comprises a substrate 12 and a light emitting layer 14, the light emitting layer 14 is positioned between the transporting layer 20 and the substrate 12, and the light emitting layer 14 is used to emit light to display an image. In an embodiment, the substrate 12 is a flexible substrate 12, in other words, the substrate 12 may be curved so as to be suitable for a flexible display device. Further, the substrate 12 may be a transparent substrate 12, such as a glass substrate 12 or a plastic substrate 12, and the like. In this example, the light emitting layer 14 is disposed on the substrate 12. In an embodiment, the light emitting layer 14 is formed on the substrate 12 by physical vapor deposition or chemical vapor deposition. The light emitting layer 14 is used to emit light to form an image, specifically, the light emitting layer 14 comprises a light emitting material layer and a driving circuit layer, the driving circuit layer is electrically connected to a power source, and the driving circuit layer drives the pixels of the corresponding light emitting material layer to emit light, thereby forming an image to be displayed. In this example, the light emitting material layer is made of an organic light emitting material, and the light emitting material layer has a better display effect and also has better curved characteristics. Further, the driving circuit layer can also be curved so as to adapt to the flexing requirements of the flexible display device.

Please continue to refer to FIG. 1. The display device 100 further comprises an insulating layer 16 positioned between the transporting layer 20 and the light emitting layer 14, the insulating layer 16 is used for isolating the transporting layer 20 from the light emitting layer 14. Specifically, the insulating layer 16 is used to separate the transporting layer 20 from the light emitting layer 14. On the one hand, the insulating layer electrically isolates the transporting layer 20 and the light emitting layer 14, so as to prevent the transporting layer 20 from short circuiting with the driving circuit layer in the light emitting layer 14 and from affecting the light emitting layer 14 to emit light. On the other hand, the transporting layer 20 and the light emitting layer 14 are physically isolated from each other to prevent the metal block 32 that has undergone the redox reaction from reacting with the light emitting material layer and from affecting the light emitting layer 14 to emit light.

Please continue to refer to FIG. 1. In this example, the packaging layer 40 comprises a first portion 42 and a second portion 44 which are interconnected into one body, and the first portion 42 is stacked on the metal layer 30, the second portion 44 is filled between the metal blocks 32 and used for isolating adjacent metal blocks 32. Specifically, the first portion 42 separates the metal layer 30 from the outside to block moisture. The second portion 44 not only assists in blocking moisture, but also serves to separate the metal blocks 32 and prevent adjacent metal blocks 32 from interacting with each other, for example, the moisture is prevented from penetrating through a certain area of the packaging layer 40 and from reacting with the metal block 32 corresponding to the area, and the moisture is prevented from flowing to the adjacent metal block 32, or the reacted metal block 32 is prevented from reacting with the unreacted metal block 32. The second portion 44 isolates adjacent metal blocks 32, thereby improving the accuracy of determining the defective position of the packaging layer 40.

A redox reaction occurs with the metal block after moisture penetrates through the packaging layer 40, so that the electric resistance of the metal block 32 will change. The metal blocks 32 are arranged in an array, each metal block 32 corresponds to a area of the packaging layer 40, the ohmmeter 50 contacts the test pin 22 to monitor the electric resistance change of the metal block 32 connected to the test pin 22, the moisture blocking effect of the area of packaging layer 40 corresponding to the metal block 32 can be determined through the electric resistance change of the metal block 32, and the area where the moisture blocking effect of the packaging layer 40 is poor can be accurately determined, which is favorable for discovering the defects in the manufacturing process of the display device 100 and can be used for evaluating whether the packaging process is qualified, and increasing the yield rate and reducing production costs.

Figure 4:
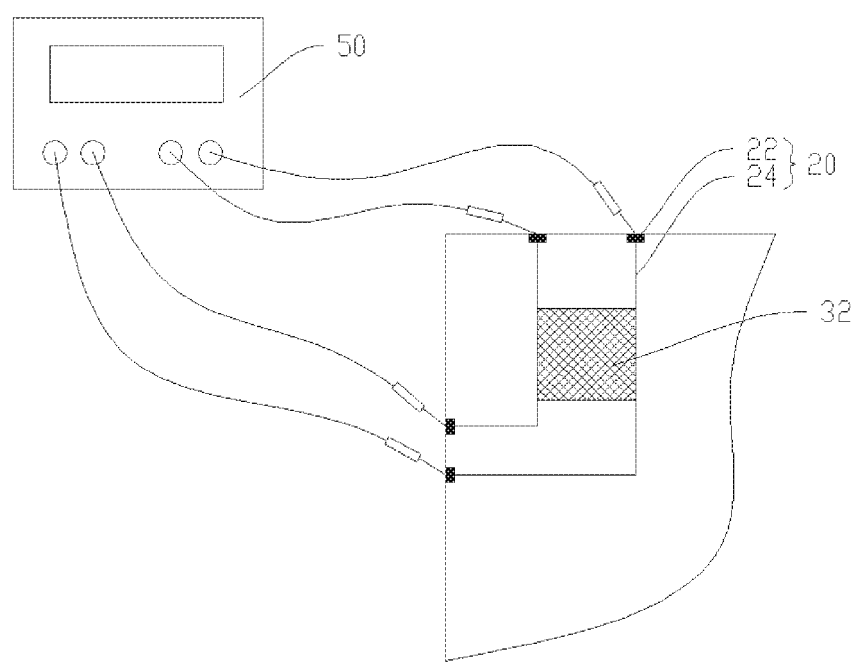
FIG. 4 is a testing schematic diagram of the moisture blocking effect of a display device.

Please refer to FIG. 4. The present example provides a test method for moisture blocking effect of the display device 100. The display device 100 comprises a light emitting base layer 10, a transporting layer 20, a metal layer 30, and a packaging layer 40 that are sequentially stacked. Further, the light emitting base layer 10 is a structure for the display device 100 to display an image. Specifically, the light emitting base layer 10 comprises a substrate 12 and a light emitting layer 14 disposed on the substrate 12. The substrate 12 has appropriate strength and is not easily broken. The substrate 12 is the main bearing structure of the display device 100, the light emitting base layer 10, the transporting layer 20, the metal layer 30, and the packaging layer 40, and the like are all disposed on the substrate 12. In an embodiment, the substrate 12 is a flexible substrate 12, in other words, the substrate 12 may be curved so as to be suitable for a flexible display device. Further, the substrate 12 may be a transparent substrate 12, such as a glass substrate 12 or a plastic substrate 12, and the like. In this example, the light emitting layer 14 is disposed on the substrate 12. In an embodiment, the light emitting layer 14 is formed on the substrate 12 by physical vapor deposition or chemical vapor deposition. The light emitting layer is used to emit light to form an image, specifically, the light emitting layer 14 comprises a light emitting material layer and a driving circuit layer, the driving circuit layer is electrically connected to a power source, and the driving circuit layer drives the pixels of the corresponding light emitting material layer to emit light, thereby forming an image to be displayed. In this example, the light emitting material layer is made of an organic light emitting material, and the light emitting material layer has a better display effect and also has a better curved characteristic. Further, the driving circuit layer can also be curved so as to adapt to the flexing requirement of the flexible display device.

Combining FIG. 1 and FIG. 2. In this example; the transporting layer 20 is disposed on the light emitting base layer 10, specifically, the transporting layer 20 is disposed on the side of the light emitting layer 14 away from the substrate 12, that is, the light emitting layer 14 is positioned between the transporting layer 20 and the substrate 12. In an embodiment, the transporting layer 20 is made of a transparent conductive material; such as indium tin oxide (ITO). According to FIG. 2 specifically, the transporting layer 20 comprises a conductive lead wire 24 and a test pin 22. In an embodiment, the conductive lead wire 24 and the test pin 22 are formed after the transporting layer 20 is patterned, such as laser etching, chemical etching, or the like. In this example; the test pin 22 is a rectangular or circular sheet-like structure that can be used to contact the probe of the ohmmeter 50.

Please continue to refer to FIG. 1. In this example, metal layer 30 is stacked on the transporting layer 20; the metal layer 30 is made of an active metal material that easily undergoes a redox reaction with water, such as magnesium; calcium, and the like. Combining with FIG. 2, the metal layer 30 comprises a plurality of metal blocks 32; specifically, the metal blocks 32 are arranged in an array; and each metal block 32 has the same size. In an embodiment, the metal blocks 32 are rectangular, and the metal blocks 32 arranged in an array are covered on the transporting layer 20. In this example, each of the metal blocks 32 is electrically connected to the test pin 32 through the conductive lead wire 24. Specifically, each test pin 22 is electrically connected to the metal block 32 through one of the conductive lead wire 24.

Please continue to refer to FIG. 1. In this example, the packaging layer 40 covers the metal layer 30, The packaging layer 40 is used to block moisture, by testing the electric resistance of the metal block 32 electrically connected to the test pin 22, the moisture blocking effect of the area of the packaging layer 40 corresponding to the metal block 32 is determined. Specifically; the packaging layer 40 is a film-like layer structure with an appropriate moisture blocking capability, the packaging layer 40 covers the metal layer 30; and separates the metal layer 30 from the outside, the outside moisture can only come into contact with the metal layer 30 after the moisture penetrates through the packaging layer 40. When the packaging effect of the packaging layer 40 is poor, or the material and thickness of the packaging 40 do not meet the requirements, the moisture blocking effect of the packaging layer 40 is poor, so that the moisture enters into the display device 100 and contacts the metal layer 30 and reacts with the metal block 32, causing the electric resistance change of the metal block 32. Further, when the packaging effect of a certain area of the packaging layer 40 is poor, the metal block 32 corresponding to the area reacts with moisture. In this example, the ohmmeter 50 contacts the test pin 22 to test the electric resistance of the metal block 32 connected to the test pin 22. Further, the ohmmeter 50 may provide a current source and voltage test mode, and the connection of the metal block 32 to the ohmmeter 50 may also be understood as the connection of metal block 32 to the current source and the voltmeter.

In this example, the display device 100 is placed in the test environment before testing the moisture blocking effect of the display device 100. The test environment is an environment with a certain temperature and humidity to simulate the actual use environment of the display device 100.

In the process of testing, the moisture blocking effect of the area of the packaging layer 40 corresponding to the metal block 32 is determined by testing the electric resistance of the metal block 32 electrically connected to the test pin 22.

The moisture will undergo redox reaction with the metal block 32 after penetrating through the packaging layer 40, and the electric resistance of the metal block 32 will change. The metal blocks 32 are arranged in an array, each metal block 32 corresponds to a area of the packaging layer 40, the ohmmeter contacts 50 the test pin 22 to monitor the electric resistance change of the metal block 32 connected to the test pin 22, the blocking effect of the area of packaging layer 40 corresponding to the metal block 32 can be determined through the electric resistance change of the metal block 32, and the area where the moisture blocking effect of the packaging layer 40 is poor can be accurately determined, which is favorable for discovering the defects in the manufacturing process of the display device 100 and can be used for evaluating whether the packaging process is qualified, and increasing the yield rate and reducing production costs.

A redox reaction occurs with the metal block after moisture penetrates through the packaging layer 40, so that the electric resistance of the metal block 32 will change. The metal blocks 32 are arranged in an array, each metal block 32 corresponds to a area of the packaging layer 40, the ohmmeter 50 contacts the test pin 22 to monitor the electric resistance change of the metal block 32 connected to the test pin 22, the blocking effect of the area of packaging layer 40 corresponding to the metal block 32 can be determined through the electric resistance change of the metal block 32, and the area where the moisture blocking effect of the packaging layer 40 is poor can be accurately determined, which is favorable for discovering the defects in the manufacturing process of the display device 100 and can be used for evaluating whether the packaging process is qualified, and increasing the yield rate and reducing production costs.

Combining FIG. 3 and FIG. 4. In this example, each of the metal blocks 32 is electrically connected to four of the test pins 22, and each of the test pins 22 is electrically connected to the metal block 32 through one of the conductive lead wires 24, the "testing the electric resistance of the metal block 32 electrically connected to the test pin 22" comprises:

connecting a current source to the two test pins 22 electrically, and connecting a voltmeter to the two other test pins 22 electrically, determining the electric resistance change of the metal block 32 by testing the voltage change of the metal block 32. Specifically, when testing the electric resistance of the metal block 32, two test pins 22 are electrically connected to the current source, so that the current flows through the metal block 32, two test pins 22 are connected to the voltmeter, i.e., the voltmeter is connected in parallel with the metal block 32, and the voltmeter measures the voltage of the metal block 32 when current flows through the metal block 32, thereby calculating the electric resistance of the metal block 32 according to Ohm's law. In an embodiment, during the period of monitoring the electric resistance change of the metal block 32, the current value of the current source connected to the metal block 32 is constant, so that the voltage change of the metal block 32 can reflect the electric resistance change of the metal block 32, that is, can reflect the moisture blocking effect of the packaging layer 40. A redox reaction occurs with the metal block after moisture penetrates through the packaging layer 40, so that the electric resistance of the metal block 32 will change. The metal blocks 32 are arranged in an array, each metal block 32 corresponds to a area of the packaging layer 40, the ohmmeter 50 contacts the test pin 22 to monitor the electric resistance change of the metal block 32 connected to the test pin 22, the moisture blocking effect of the area of packaging layer 40 corresponding to the metal block 32 can be determined through the electric resistance change of the metal block 32, and the area where the moisture blocking effect of the packaging layer 40 is poor can be accurately determined, which is favorable for discovering the defects in the manufacturing process of the display device 100 and can be used for evaluating whether the packaging process is qualified, and increasing the yield rate and reducing production costs.

Above are embodiments of the present invention, which does not limit the scope of the present invention. Any modifications, equivalent replacements or improvements within the spirit and principles of the embodiment described above should be covered by the protected scope of the invention.

What is claimed is:

1. A display device, comprising a light emitting base layer, a transporting layer, a metal layer and a packaging layer that are sequentially stacked;
   the transporting layer comprising a conductive lead wire and a test pin;
   the metal layer comprising a plurality of metal blocks arranged in an array, each of the metal blocks being electrically connected to the test pin through the conductive lead wire; and
   the packaging layer being used for blocking outside moisture from contacting the metal layer, by testing the electric resistance of the metal block electrically connected to the test pin, determining the moisture blocking effect of the area of the packaging layer corresponding to the metal block;
   wherein the packaging layer is formed of a moisture-blocking material and comprises a first portion and a second portion which are interconnected into one body, and the first portion of the moisture-blocking material is stacked on the metal layer, and the second portion of the moisture-blocking material is filled between the metal blocks to isolate adjacent metal blocks from each other so that the second portion of the moisture-blocking material prevents moisture from flowing between the adjacent metal blocks.

2. The display device according to claim 1, wherein the material of the metal layer is one of calcium and magnesium.

3. The display device according to claim 1, wherein each of the metal blocks is electrically connected to four of the test pins, and each of the test pins is electrically connected to the metal block through one of the conductive lead wires, and the two test pins are electrically connected to a current source, and the other two test pins are electrically connected to a voltmeter.

4. The display device according to claim 3, wherein the material of the metal layer is one of calcium and magnesium.

5. The display device according to claim 3, wherein a connection point is formed between the conductive lead wire and the metal block, and the distance between two adjacent connection points of the four is the same.

6. The display device according to claim 5, wherein the material of the metal layer is one of calcium and magnesium.

7. The display device according to claim 1, wherein the vertical projection of the test pin on the light emitting base layer is positioned at the edge of the light emitting base layer.

8. The display device according to claim 7, wherein the material of the metal layer is one of calcium and magnesium.

9. The display device according to claim 1, wherein the light emitting base layer comprises a substrate and a light emitting layer, and the light emitting layer is positioned between the transporting layer and the substrate, and the light emitting layer is used to emit light to display an image.

10. The display device according to claim 9, wherein the material of the metal layer is one of calcium and magnesium.

11. The display device according to claim 9, wherein the display device further comprises an insulating layer positioned between the transporting layer and the light emitting layer, and the insulating layer is used for isolating the transporting layer from the light emitting layer.

* * * * *